United States Patent
Radosavljevic et al.

(10) Patent No.: US 11,335,801 B2
(45) Date of Patent: May 17, 2022

(54) GROUP III-NITRIDE (III-N) DEVICES WITH REDUCED CONTACT RESISTANCE AND THEIR METHODS OF FABRICATION

(71) Applicant: Intel Corporation, Santa Clara, CA (US)

(72) Inventors: Marko Radosavljevic, Portland, OR (US); Han Wui Then, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 71 days.

(21) Appl. No.: 16/642,866

(22) PCT Filed: Sep. 29, 2017

(86) PCT No.: PCT/US2017/054631
§ 371 (c)(1),
(2) Date: Feb. 27, 2020

(87) PCT Pub. No.: WO2019/066973
PCT Pub. Date: Apr. 4, 2019

(65) Prior Publication Data
US 2020/0220004 A1 Jul. 9, 2020

(51) Int. Cl.
*H01L 29/778* (2006.01)
*H01L 29/08* (2006.01)
(Continued)

(52) U.S. Cl.
CPC ...... *H01L 29/7787* (2013.01); *H01L 29/0847* (2013.01); *H01L 29/2003* (2013.01); *H01L 29/205* (2013.01); *H01L 29/66462* (2013.01)

(58) Field of Classification Search
None
See application file for complete search history.

(56) References Cited

U.S. PATENT DOCUMENTS 8,319,287 B2   11/2012  Lavoie et al.
9,997,409 B1 *  6/2018  Czornomaz ....... H01L 29/78654
(Continued)

FOREIGN PATENT DOCUMENTS

WO   2016209263   12/2016

OTHER PUBLICATIONS

Dasgupta, S. "Ultralow unalloyed Ohmic contact resistance to self aligned N-polar GaN high electron mobility transistors by In(Ga)N regrowth" App. Phys. Lett. 96, Apr. 7, 2010 pp. 143504-1 through 143504-3 (Year: 2010).*

(Continued)

*Primary Examiner* — Grant S Withers
(74) *Attorney, Agent, or Firm* — Essential Patents Group, LLP

(57) ABSTRACT

A device including a III-N material is described. In an example, a device includes a first layer including a first group III-nitride (III-N) material and a polarization charge inducing layer, including a second III-N material, above the first layer. The device further includes a gate electrode above the polarization charge inducing layer and a source structure and a drain structure on opposite sides of the gate electrode. The source structure and the drain structure both include a first portion adjacent to the first layer and a second portion above the first portion, the first portion includes a third III-N material with an impurity dopant, and the second portion includes a fourth III-N material, where the fourth III-N material includes the impurity dopant and further includes indium, where the indium content increases with distance from the first portion.

20 Claims, 10 Drawing Sheets

(51) Int. Cl.
*H01L 29/20* (2006.01)
*H01L 29/205* (2006.01)
*H01L 29/66* (2006.01)

(56) References Cited

U.S. PATENT DOCUMENTS

| | | |
|---|---|---|
| 2010/0327322 A1 | 12/2010 | Kub et al. |
| 2011/0291159 A1* | 12/2011 | Shih .................... H01L 29/7787 257/194 |
| 2014/0091308 A1* | 4/2014 | Dasgupta ............ H01L 29/2003 257/76 |
| 2015/0255589 A1 | 9/2015 | Fenwick |
| 2016/0315153 A1 | 10/2016 | Then et al. |
| 2016/0330795 A1* | 11/2016 | Choi .................... H01L 29/7787 |

OTHER PUBLICATIONS

International Preliminary Report on Patentability from PCT/US2017/054631 dated Apr. 9, 2020, 13 pgs.
International Search Report and Written Opinion for International Patent Application No. PCT/US2017/054631, dated Jun. 29, 2018.

\* cited by examiner

GROUP III-NITRIDE (III-N) DEVICES WITH REDUCED CONTACT RESISTANCE AND THEIR METHODS OF FABRICATION

CLAIM OF PRIORITY

This Application is a National Stage Entry of, and claims priority to, PCT Patent Application No. PCT/US2017/054631, filed on Sep. 29, 2017 and titled "GROUP III-NITRIDE (III-N) DEVICES WITH REDUCED CONTACT RESISTANCE AND THEIR METHODS OF FABRICATION", which is incorporated by reference in its entirety for all purposes.

BACKGROUND

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more diodes in conjunction with one or more transistors, such as one or more field-effect transistors (FETs). Due, in part, to their large bandgap and high mobility, gallium nitride (GaN) and other group III-N semiconductor materials are suited for integrated circuits for applications such as high-frequency and high-power.

For many non-silicon device materials, it can be challenging to provide doped semiconductor material suitable for making a good ohmic contact. Contact structures and techniques to reduce contact resistance and sheet resistance may advantageously reduce overall device resistance to enhance device performance and/or reduce device power consumption.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
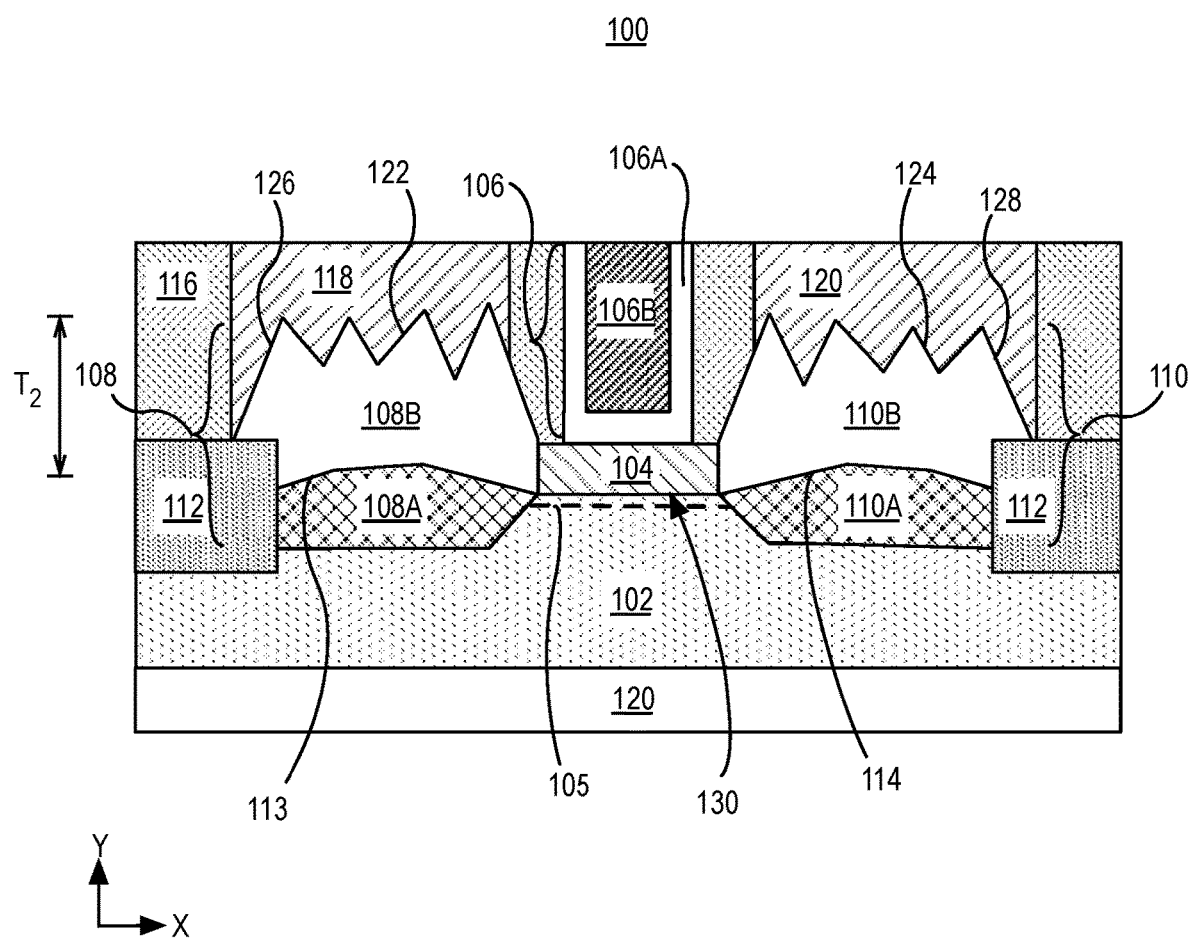
FIG. 1A illustrates a cross-sectional view of a group III-N transistor having a source and drain structures with graded indium content in accordance with embodiments of the present invention.

Devices including group III-N semiconductor materials for logic, SoC and memory applications and their methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as enhancement mode operations associated with group III-N devices, are described in lesser detail in order to not unnecessarily obscure embodiments of the present invention. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In the fields of wireless communication and power management, various components can be implemented using solid-state devices. For example, in radio frequency (RF) communication, the RF front-end is a generic term for the circuitry between an antenna and a digital baseband system. Such RF front-end components may include one or more transistors, such as one or more field-effect transistors (FETs). Due, in part, to their large bandgap and high mobility, gallium nitride (GaN) and other group III-N semiconductor materials are suited for integrated circuits for applications such as high-frequency and high-power. However, optimizing power efficiency of RF-front end components and minimizing energy loss during operation is highly desirable. Devices such as transistors fashioned from group III-N semiconductor materials, may be susceptible to energy loss from various sources such as from conduction and switching losses. The latter is affected by the transition between "on" and "off" states during device operation. In particular, transitioning between on and off states of the transistor may be affected by resistances within the device. Device resistances include internal resistances associated with carrier mobility within the channel material, resistances associated with differences in material between channel material and source and drain structures or access resistance and external resistances between the channel material and external contacts associate with source and drain resistances and metal-semiconductor junction resistances. III-N channels generally have high carrier mobility, but to fully capitalize on this attribute, external and internal resistance should be minimized. Thus, pathways to minimize contact resistance and access resistance are especially attractive for practical realization of devices based on group III-N semiconductor materials.

In an embodiment of the present disclosure, a device, such as a transistor includes a first layer having a first group III-nitride (III-N) semiconductor material. A polarization charge inducing layer is above the first layer, the polarization charge inducing layer includes a second III-N material. The polarization charge inducing layer induces a 2-dimensional electron gas (2DEG) in the first layer below an interface between the polarization charge inducing layer and the underlying first III-N material of the first layer. The transistor further includes a gate electrode above the polarization charge inducing layer, a source structure on one side of the gate electrode and a drain structure on the opposite side of the source structure. The source structure and the drain structure both include a first portion adjacent to the first layer and a second portion above the first portion. The first portion of the source or the drain structure includes a third III-N material with an impurity dopant, such as n-type dopant, where the third III-N material is substantially lattice matched and band aligned to the first III-N material. Band alignment between the first III-N material and the third III-N material improves conduction between the source and a channel. With improved band alignment, electrons from the first portion of the source structure can flow into the 2DEG region with virtually no access resistance.

The second portion of the source and the drain structures include a fourth III-N material. The fourth III-N material includes an impurity dopant, such as n-type dopant, and further includes indium, where the indium content increases with distance from the first portion. By increasing the indium content of the second portions of the source and the drain structures, the conductivity of the source structure may be increased. In an embodiment, increasing the indium content to 10% of the total composition of the source structure or the drain structure, can result in a metallic uppermost portion of the second portion of the source and the drain structures. Increasing indium content may lower the bandgap of the second portion of the source and the drain structures. When uppermost portions of the source and the drain structures with reduced bandgap, are in contact with a source and drain contact structures, contact resistance of the metal and the semiconductor junction can be reduced.

FIG. 1A illustrates a cross-sectional illustration of a device 100, such as a group III-N transistor 100, including a channel layer 102 having a first group III-nitride (III-N) material. A polarization charge inducing layer 104 is above the channel layer 102. The polarization charge inducing layer 104 includes a III-N material. The polarization charge inducing layer 104 induces a 2-dimensional electron gas (2DEG is indicated by the dashed lines 105) within channel layer 102 near an interface 130 between the polarization charge inducing layer 104 and the channel layer 102. The transistor 100 further includes a gate electrode 106 above the polarization charge inducing layer 104, a source structure 108 on one side of the gate electrode 106 and a drain structure 110 on the opposite side of the source structure 108.

The source structure 108 includes a source portion 108A on the channel layer 102, and a source portion 108B on the source portion 108A. The source portion 108A may be in partial or in full contact with a sidewall of the polarization charge inducing layer 104. The source portion 108B may, or may not, be in direct contact with the polarization charge inducing layer 104. The source portion 108A includes a III-N material with an impurity dopant and the source portion 108B includes a III-N material with an impurity dopant and indium, where the indium content increases with distance from the source portion 108A towards an upper surface of the second structure portion 108B. Likewise, the drain structure includes a drain portion 110A on the channel layer 102 and a drain portion 110B on drain portion 110A. The drain portion 110A may be in partial or in full contact with a sidewall of the polarization charge inducing layer 104. The drain portion 110B may or may not be in direct contact with the polarization charge inducing layer 104. The drain portion 110A includes a III-N material with an impurity dopant and the source portion 108B includes a III-N material with an impurity dopant and indium, where the indium content increases with distance from the drain portion 110A towards an upper surface of the drain portion 110B. A source contact 118 is above and in contact with the source structure 108 and a drain contact 118 is above and in contact with the drain structure 110.

In an embodiment, the source portion 108A is substantially lattice matched and band aligned to the channel layer 102. Band alignment between the source portion 108A and the channel layer 102 improves electron conduction between the source portion 108A and the 2DEG (indicated by dashed lines 105) present under an interface 130 between the polarization charge inducing layer 104 and the channel layer 102. With improved band alignment, electrons from the source portion 108A can flow into the 2DEG region with lower access resistance. In the illustrative embodiment, the source portion 108A has an upper surface 113 that is marginally above the interface 130 ensuring intimate contact with the 2DEG 105 for unimpeded electron transport. The surface 113 may have a surface roughness characteristic of binary GaN alloys, such as a surface roughness for example between 2 nm-5 nm. Depending on embodiments, the source portion 108A has a thickness between 10 nm-20 nm.

In an embodiment, the drain portion 110A is substantially lattice matched and band aligned to the channel layer 102. Band alignment between the drain portion 110A and the channel layer 102 improves conduction between the drain portion 110A and the 2DEG 105. With improved band alignment, electrons from the drain portion 110A can flow into the 2DEG region with minimal access resistance. In the illustrative embodiment, the source portion 108A has an upper surface 114 that is marginally above the interface 130 ensuring intimate contact with the 2DEG 105 for unimpeded electron transport. The surface 114 may have a surface roughness characteristic of binary GaN alloys, such as a surface roughness for example between 2 nm-5 nm. Depending on embodiments, the drain portion 110A has a thickness between 10 nm-20 nm.

In an embodiment, the indium content in the source portion 108B and in the drain portion 110B increase along a thickness $T_2$, as measured vertically upwards from the uppermost surfaces 113 and 114, respectively. In an embodiment, an indium content increases from 1 atomic percent to approximately 10 atomic percent of the source portion 108B (and of the drain portion 110B), across a thickness $T_2$, and across a thickness $T_2$, A change in the indium content, across the thickness $T_2$, from 1 atomic percent to approximately 10 atomic percent has an effect of gradually lowering the bandgap from a value close to 3.4 eV to a value approximately between 3.01-3.14 eV. In an embodiment, upper portions of the source portion 108B and drain portion 110B having an indium content of 10 atomic percent of the source portion 108B and drain portion 110B can help reduce the barrier height between the source contact 118 and the source portion 108B and between the drain contact 120 and the drain portion 110B. A lower barrier height may reduce the contact resistance of the device 100. In an embodiment, source portion 108B and the drain portion 110B each have a thickness $T_2$, between 30 nm to 80 nm.

In the illustrative embodiment, the source portion 108B and the drain portion 110B are characterized by uppermost surfaces 122 and 24 that are corrugated, where the corrugation is between 5 nm-20 nm. In an embodiment, the corrugation arises from the presence of the indium in the source portion 108B and drain portion 110B. The corrugation may also co-relate with the percent of indium in the source portion 108B and drain portion 110B. For instance, an upper portion of the source portion 108B and drain portion 110B having a 10% indium content may have a greater corrugation compared to the source portion 108B and drain portion 110B having a 5% indium content. In an embodiment, an increase in indium content across the thickness $T_2$, correlates with the presence of micro layers in the source portion 108B and drain portion 110B. The microlayers form a continuous band of III-N material, with each successive band including a uniformly n-doped III-N material with a given indium content that increases along the thickness $T_2$. In an embodiment, each band of III-N material has an increasing amount of corrugation closely related to the indium content. In one embodiment, corrugated uppermost surfaces 113 and 114 of the source portion 108B and drain portion 110B, respectively can have an approximately uniform indium composition. In other embodiments, the indium content can vary within different portions of the corrugated upper surface 113 and 114.

In the illustrative embodiment, the source portion 108B and drain portion 110B also include faceted crystals having sidewalls, such as sidewalls 126 and 128. In an embodiment, the sidewalls 126 and 128 are approximately 60 degrees with respect to an uppermost surface of the polarization charge inducing layer 104. Sidewalls of the source structure 108 and drain structure 110 along a plane orthogonal to the X-Y plane of the cross-sectional illustration of FIG. 1A may also faceted at approximately 60 degrees.

Figure 1B:
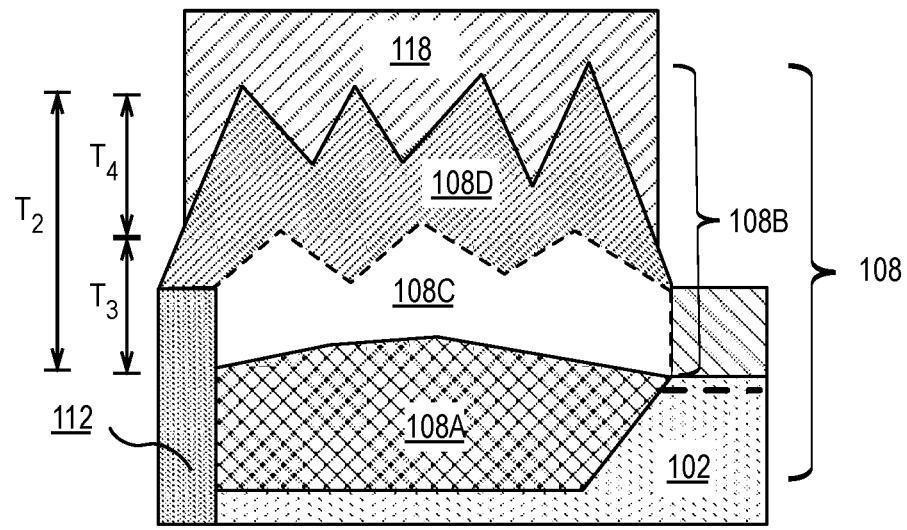
FIG. 1B illustrates a cross-sectional view of a second portion of the source structure having two distinct bands of indium concentrations, in accordance with an embodiment of the present disclosure.

FIG. 1B illustrates an embodiment, where a source portion 108B is depicted as having two bands of n-doped III-N material, each with a distinct indium content across the thickness $T_2$. In the illustrative embodiment, two distinct concentrations in indium divides the source portion 108B (of the source structure 108) into a lower portion 108C, and an upper portion 108D on the lower portion 108C. In one embodiment, the lower portion 108C includes a III-N material having an indium content between 1%-2% to minimize lattice mismatch with the underlying source portion 108A. In one such embodiment, the upper portion 108D includes a III-N material having an indium content between 9%-10% to lower the bandgap in the vicinity of the source contact 118. In an example, the lower portion 108C has an indium content that increases in some fashion from approximately 1% to 5% and portion 108D has an indium content that increases in the same or a different fashion from approximately 6%-10%. In an exemplary embodiment, the change in the indium content in the lower portion 108C increases rapidly from 1%-5% and the change in the indium concentration in the upper portion 108D increases slowly from 6%-10%. Thus, by controlling the amount of indium across $T_2$, the band gap and lattice structure across the thickness $T_2$ may be modulated. In the illustrative embodiment, the portion 108C has a thickness $T_3$, and the portion 108D has a thickness $T_4$. In an embodiment, the $T_3$, and $T_4$ can be equal or skewed for example T3 can be smaller than T4. In yet another embodiment, T3 can be larger than T4. It is to be appreciated that the lower portion 108C having a lower indium content has a lower level of corrugation of surface 132, compared to corrugation of surface 134 of the upper portion 108D having a higher indium content. In embodiments, lattice mismatch can result from variation in indium content within the III-N material, but the overall composition of the III-N material is relatively insensitive to defects arising from lattice mismatch between portions 108C and 108D for the differences of 10% in indium under consideration.

Figure 1C:
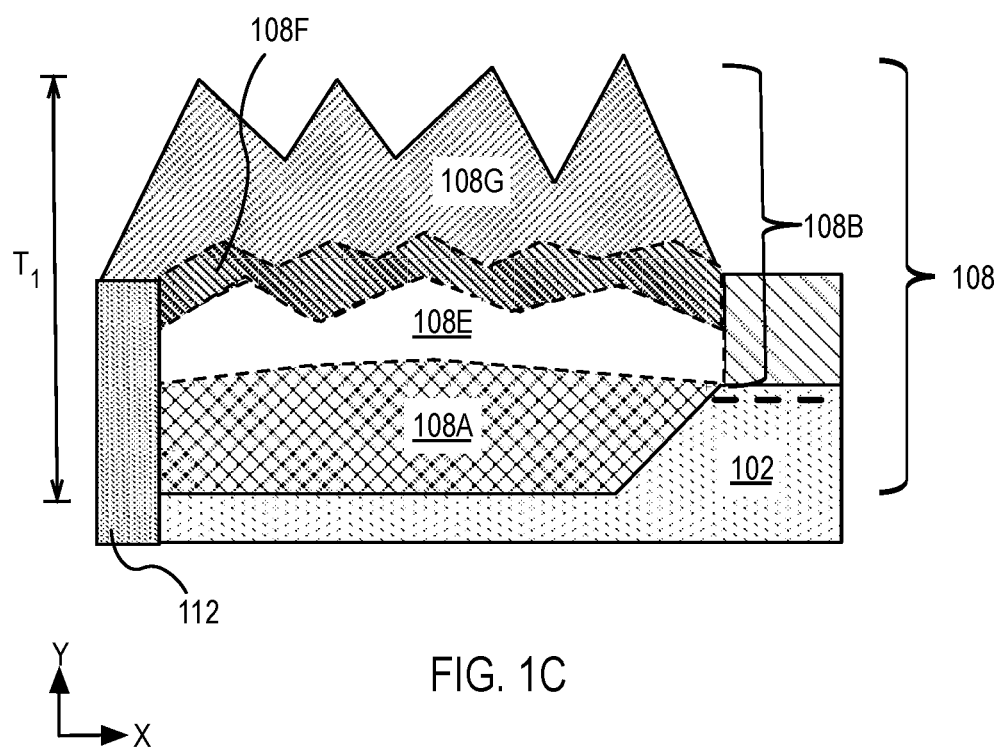
FIG. 1C illustrates a cross-sectional view of a second portion of the source structure having three distinct bands of indium concentrations, in accordance with an embodiment of the present disclosure.

FIG. 1C illustrates an embodiment, where the source portion 108B has three distinct portions 108E, 108F and 108G, where the indium concentration increases between each successive portion. In an embodiment, portion 108E is on the source portion 108A, the portion 108F is on portion 108E and portion 108G is on portion 108F as is depicted in the cross-sectional illustration of FIG. 1C. In an embodiment, the indium concentration across 108E has a rapid gradient from 1%-4%, the indium concentration across 108F can be fixed at 5% and the indium concentration can have a slow gradient across 108G where the indium content varies from 6%-10% across $T_4$. The relative thickness of each portion 108E, 108F and 108G can be equal or be distinctly different from each other depending on the embodiment. In an embodiment, the source structure 108 has a height, $T_1$ between 50 nm-100 nm. In one such embodiment, the source portion 108A has a thickness between 10 nm-20 nm, the portion 108E has a thickness between 10-20 nm, portion 108C has a thickness between 5 nm-10 nm and portion 108D has a thickness between 20 nm-50 nm.

The drain structure 110 may include one or more embodiments of the source structure 108 described in association with FIGS. 1B and 1C. These embodiments may include the same or substantially the same material compositions and thicknesses.

Referring once again to FIG. 1A, in an embodiment, the source portion 108A includes a material having an indium content that is less than the indium content of the source portion 108B. When the source portion 108A includes indium, the source portion 108A may be lattice mismatched from the channel layer 102. However, addition of indium may sufficiently reduce the bandgap of the source portion 108A and may compensate for potential impediment to electron transport between mismatched lattice structures. In an exemplary embodiment, the indium content in the source portion 108A may be between 0.1% and 1% and the indium content in the source portion 108B increases from 1%-10% across the thickness $T_2$. An indium content between 0.1% and 0.8% in the first source structure portion 108A may minimize lattice mismatch between the source portion 108A and the source portion 108B.

In an embodiment, the channel layer 102 includes a III-N material such as gallium nitride (GaN). In one such embodiment, the channel layer 102 has a relatively high carrier mobility, (greater than 500 cm$^2$ V$^{-1}$). The channel layer 102 may be a substantially un-doped group III-nitride material (i.e., $O_2$ impurity concentration minimized) for minimal impurity scattering. In other embodiments, the channel layer 102 includes one or more ternary alloys of GaN, such as AlGaN, AlInN, or a quaternary alloy of GaN including at least one group III element and nitrogen, such as $In_xAl_yGa_{1-x-y}N$, where x ranges from 0.01-0.1 and y ranges from 0.01-0.1. Depending on applications, the channel layer 102 has a thickness between 100 nm–5 µm.

In an exemplary embodiment, the source structure 108 and the drain structure 110 include an impurity dopant such as an n-type dopant or an n+ dopant. Examples of an n-type dopant includes a material such as Si or Ge. In one embodiment, the n-type dopant material is silicon. As a further example, the silicon n-type dopant may have a n-dopant density of at least 1e19/cm$^3$.

In an embodiment, the source portion 108A includes a III-N material that is lattice matched to the channel layer 102. In one exemplary embodiment, where the channel layer 102 includes GaN, the source portion 108A includes single crystal GaN to facilitate lattice matching. In a different embodiment, where the channel layer 102 includes GaN, the source portion includes a single crystal of InGaN, where the atomic percent of indium in InGaN is between 0.1% to a maximum of 1%.

In an embodiment, when the source portion 108A includes GaN, and the source portion 108B includes InGaN having an indium content of 1% or less, proximate to the source portion 108A, the source portion 108B may be lattice matched to between 5%-15% to the source portion 108A including GaN. In one such embodiment, the source portion 108B including InGaN and having an indium content of less than 1% may also have a band gap that is sufficiently close to the bandgap of GaN (3.4 eV). As a further example, a source portion 108B including InGaN with a 10% indium concentration proximate to the source contact 118 including a metal such as tungsten, can facilitate a lower contact resistance of device 100.

In an embodiment, the polarization charge inducing layer 104 includes a suitable second III-N material. In an embodiment, the polarization charge inducing layer 104 includes a material such as but not limited to $Al_zGa_{1-z}N$, $Al_wIn_{1-w}N$, or AlN, where Z ranges from 0.2-0.3 and W ranges from 0.7-0.85. One combination includes a polarization charge inducing layer 104 that is AlGaN and a channel layer 102 that is GaN. In one such combination, the AlGaN polarization charge inducing layer 104 has a bandgap (3.7 eV) that is wider than the bandgap of the GaN channel layer 102 (3.4 eV), facilitating a quantum well at the interface between the AlGaN polarization charge inducing layer 104 and the GaN channel layer 102. In an embodiment, the polarization charge inducing layer 104 has a thickness sufficient to introduce a polarization difference in the interface 130 between the channel layer 102 and the polarization charge inducing layer 104, creating a 2DEG 105 in the vicinity of an uppermost surface of the channel layer 102. Depending on the choice of material, the polarization charge inducing layer 104 has a thickness between 3 nm and 20 nm. In an exemplary embodiment, the polarization charge inducing layer 104 is AlInN, a thickness between 3 nm and 10 nm. The presence of the 2DEG 105 leads to current conduction in the channel between the source structure 108 and the drain structure 110 in the device 100. In the illustrative embodiment, by negatively biasing the gate 106 relative to the drain contact 110, the 2DEG is turned off.

The gate dielectric layer 106A may have a high relative permittivity (i.e., dielectric constant, K). In some high-K gate dielectric embodiments, the gate dielectric layer 106A is a metal oxide (e.g., including oxygen and one or more metals, such as, but not limited to, aluminum, hafnium, zirconium, tantalum or titanium). In another embodiment, the gate dielectric layer 106A includes a silicon dioxide or a silicon nitride. In some examples, the gate dielectric layer 106A has a thickness between 2 nm and 10 nm.

In an embodiment, the gate electrode 106B includes a metal such as but not limited to Pt, Ni and an alloy such as TiN or TaN. In one such embodiment, the gate electrode 106B has a length, $L_G$, approximately in the range of 10-30 nm. In some embodiments, the gate electrode 106B further includes a work function metal and a gate cap. The work function metal may include a metal such as Pt, Ni, and an alloy such as TiN or TaN and the gate cap may include a metal such as W.

In an embodiment, the source contact 118, and the drain contact 120 each include a single layer of metal such as W or Ru. Examples of source contact 118, and the drain contact 120 may also include a multi-layer stack. Depending on the material of the source structure 108 and drain structure 110 the multi-layer stack includes two or more distinct layers of metal such as a layer of Ti, Ru, or Al and a conductive cap on the layer of metal. The conductive cap may include a material such as W or Cu.

The device 100 also includes an isolation layer 112 adjacent to the source structure 108 and drain structure 110. Examples of the isolation layer 112 may include any material that has sufficient dielectric strength to provide electrical isolation such as, but not to, limited silicon dioxide, silicon nitride, silicon oxynitride, carbon doped nitride and carbon doped oxide.

In the illustrative embodiment, the source contact 118, the drain contact 120 and the gate 106 are disposed in a dielectric layer 116. Examples of the dielectric layer 116 may include any material that is sufficiently strong to provide electrical isolation such as, but not to, limited silicon dioxide, silicon nitride, silicon oxynitride, carbon doped nitride and carbon doped oxide.

In an embodiment, the dielectric layer 116 includes a material that is the same or substantially the same as the isolation layer 112.

In an embodiment, the substrate 120, includes a semiconductor material such as but not limited to silicon, silicon germanium (Ge) or silicon carbide (SiC). In an exemplary embodiment, the substrate 120 is a silicon substrate having a (100) top surface. A silicon substrate 120 with a (100) top surface enables co-integration of silicon CMOS transistor technology with a III-N material. In a second embodiment, the silicon substrate 120, has a (111) top surface. In embodiments, the channel layer 102 and the substrate 120 have mismatched lattice structures. The lattice mismatch between the channel layer 102 and the substrate 120 may be between 15%-50%.

FIGS. 2A-2I illustrate cross-sectional view representing various operations in a method of fabricating a group III-N transistor, in accordance with embodiments of the present invention.

Figure 2A:
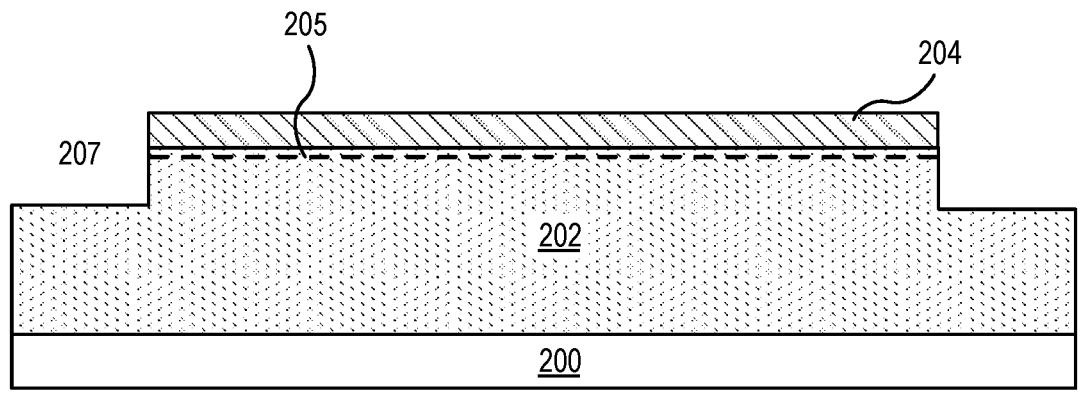
FIG. 2A illustrates a cross-sectional view of a patterned polarization charge inducing layer on a patterned first III-N material, in accordance with an embodiment of the present invention.

FIG. 2A illustrates a cross-sectional view of a patterned polarization charge inducing layer 204 on a patterned first layer 202 formed above a substrate 200, in an accordance with an embodiment of the present invention. In an embodiment, the first layer 202 is grown on the substrate 200 by a metal organic chemical vapor deposition (MOCVD) process at a temperature in the range of 1000-1100 degrees Celsius. In an embodiment, the first layer 202 has a material composition that is the same or substantially the same as the first layer 102. In an embodiment, the first layer 202 is a GaN layer. In an embodiment, the GaN-first layer 202 is grown to a thickness that is approximately in the range of 100 nm-5 micrometers. A GaN-first layer 202 may have a defect density less than (1 e10/cm2) when grown to a thickness of at least 100 nm.

In an embodiment, the polarization charge inducing layer 204 is formed on the group III-N semiconductor material 202. The polarization charge inducing layer 204 may be formed using a MOCVD process and grown immediately after the growth of the group III-N semiconductor material 202. In an embodiment, the polarization charge inducing layer 204 is grown by a MOCVD process at a temperature in the range of 1000-1100 degrees Celsius. Depending on the embodiment, the polarization charge inducing layer 204 includes a III-N material such as but not limited to AlN, AlInN or $Al_yGa_{1-y}N$ (where y is 0.24-0.36) and the first layer 202 includes a material such as but not limited to InGaN or GaN. The polarization charge inducing layer 204 may be grown to a thickness between 3 nm and 20 nm. In an exemplary embodiment, the polarization charge inducing layer 204 is AlInN. A polarization charge inducing layer 204 having a thickness between 3 nm-10 nm may induce strain in an uppermost surface of the first layer 202. The presence of sufficient strain in the first layer 202 induces 2DEG (represented by dashed lines 205) in the strained region.

In an embodiment, the substrate 200, includes a semiconductor material such as but not limited to silicon, silicon germanium (Ge) or silicon carbide (SiC). In an exemplary embodiment, the substrate 200 is a silicon substrate having a (100) top surface. A silicon substrate 200 with a (100) top surface enables co-integration of silicon CMOS transistor technology with a first layer 202. In a second embodiment, the silicon substrate 200, has a (111) top surface. In embodiments, the first layer 202 and the substrate 200 have lattice mismatch. The lattice mismatch between the first layer 202 and the substrate 200 may be between 15%-50%.

In an embodiment, a mask (not shown) is formed on the polarization charge inducing layer 204. In one embodiment, a plasma etch process is utilized to etch the polarization charge inducing layer 204 and the first layer 202 through an exposed area in the mask to form openings 207. The openings 207 are formed sufficiently deep to subsequently define isolation regions. In one embodiment, the openings 207 have a depth between 75 nm and 200 nm.

Figure 2B:
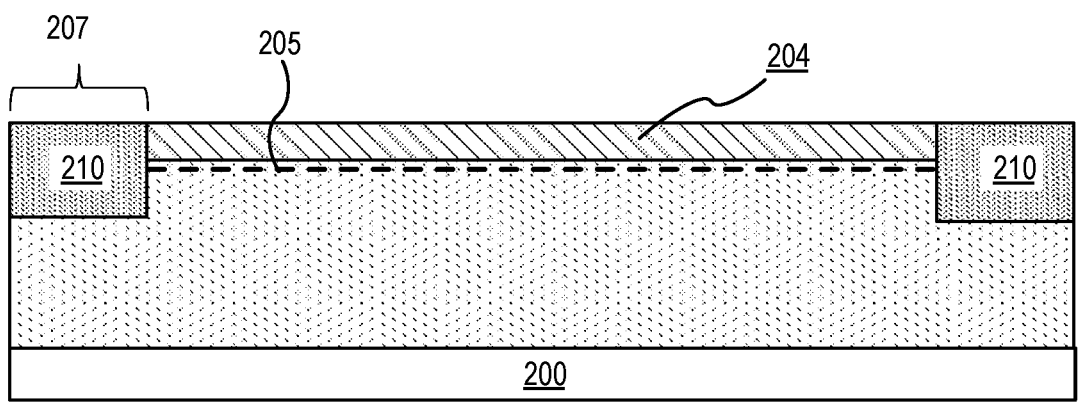
FIG. 2B illustrates the structure of FIG. 2A following the formation of isolation structures surrounding the patterned polarization charge inducing layer and the patterned first III-N material.

FIG. 2B illustrates the structure of FIG. 2A following the formation of an isolation layer 210 surrounding the polarization charge inducing layer 204 and the patterned first layer 202. In an embodiment, an isolation layer 210 is blanket deposited on the surface of the polarization charge inducing layer 204 and on the patterned group III-N semiconductor material 202. Examples of the isolation layer 210 may include any material that is sufficiently strong to provide electrical isolation such as, but not to, limited silicon dioxide, silicon nitride, silicon oxynitride, carbon doped nitride and carbon doped oxide. The isolation layer 210 is subsequently planarized, for example using a chemical mechanical polish process. In the embodiment depicted in the cross-sectional illustration of FIG. 2B, the CMP process leaves the isolation layer 210 having an uppermost surface that is co-planar or substantially co-planar with an uppermost surface of the polarization charge inducing layer 204.

Figure 2C:
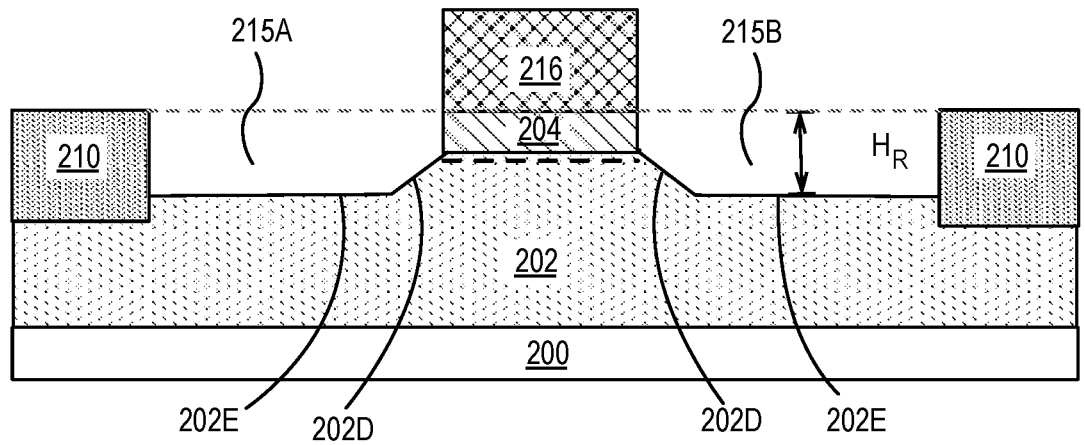
FIG. 2C illustrates a cross-sectional view of the structure of FIG. 2B following the formation of trenches in portions of the polarization charge inducing layer, and in portions of the III-N material adjacent to the isolation structures.

FIG. 2C illustrates a cross-sectional view of the structure of FIG. 2B following the formation of trenches 215A and 215B by patterning portions of the polarization charge inducing layer 204, and portions of the first layer 202 adjacent to the isolation layer 210. In an embodiment, a mask 214 is formed on a portion of the polarization charge inducing layer 204. The mask 214 may include a material that can withstand high temperature processing such as a silicon oxide or a silicon nitride. In an embodiment, a plasma etch process is utilized to etch unmasked portions of the polarization charge inducing layer 204 to uncover the first layer 202. In an embodiment, the etch is then resumed and removes portions of the uncovered first layer 202 to form trenches 215A and 215B. The trenches 215A and 215B are each recessed by an amount, $H_R$. In an embodiment, $H_R$, is between 30 nm and 100 nm. The patterned group III-N semiconductor material 202, has sloped sidewalls 202D and an approximately flat lowermost surfaces 202E. The sloped sidewalls 202D may be defined by a linear facet or have a profile that has a compound slope (not depicted). The trenches 215A and 215B may have a height and width chosen to enable subsequent epitaxial formation of source and drain structures having a contact resistance of less than 200 ohms-micron.

Figure 2D:
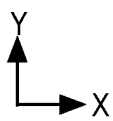
FIG. 2D illustrates a cross-sectional view of the structure of FIG. 2C following the formation of drain structures and source structures in the trenches.
Figure 2D:
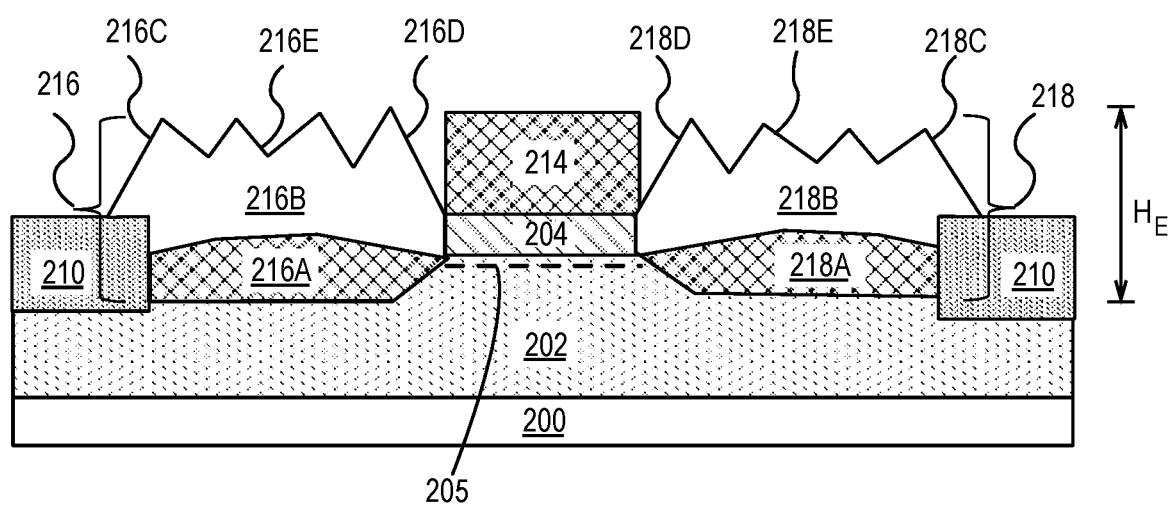

FIG. 2D illustrates a cross-sectional view of the structure of FIG. 2C following the formation of source structure 216 in the trench 215A and drain structure 218 in the trench 215B. In an embodiment, the growth process of the source structure 216 and drain structure 218 begins by growing a source portion 216A and a drain portion 218A from the exposed, undamaged surface of first layer 202 in the recesses 215A and 215B, respectively, using a metal organic chemical vapor deposition (MOCVD) process. The MOCVD process may be carried out at process temperatures between 1000 and 1100 degrees Celsius. In an embodiment, a source portion 216A and a drain portion 218A, are epitaxially grown in the trenches 215A and 215B respectively and cover the 2DEG 205. In an embodiment, the source portion 216A and the drain portion 218A include an indium deficient material such as GaN. In an embodiment, the growth process results in a source portion 216A and a drain portion 218A having uppermost surfaces that are absent of corrugation but the surfaces can nonetheless have a roughness between 2 nm-5 nm.

The MOCVD process is continued to form a source portion 216B and a drain portion 218B. The MOCVD process is characterized by addition of indium during the deposition process. Depending on embodiments, the amount of indium added to the material being deposited and the rate of deposition can be varied. In an exemplary embodiment, a layer of InGaN is grown, where the amount of indium is increased from 1 to 10 atomic percent of the total amount of InGaN over the duration of the growth process. In an embodiment, the portion of the source portion 216B and a drain portion 218B formed at the interface with uppermost surfaces the source portion 216A and the drain portion 218A, respectively is less indium rich compared to an upper portion of the source portion 216B and a drain portion 218B.

In a process known as lateral epitaxial overgrowth (LEO), conditions are engineered to favor advancing a lateral growth face of a nucleated crystal of the source portion 216B and the drain portion 218B as illustrated in the cross-sectional illustration of FIG. 2D. In one example, the lateral growth face manifests in a sloped sidewalls 216C and 216D on the source portion 216B and sloped sidewalls 218C and 218D on the drain portion 218B. In an embodiment, the sidewalls 216C, 216D, 218C and 218D are inclined at approximately 60 degrees with respect to an uppermost surface of the first layer 202. In the illustrative embodiment, upper surfaces 216E and 218E of the source structure 216 and the drain structure 218, respectively, become corrugated as a result of the presence of indium in the epitaxial growth process. In an embodiment, the corrugation is between 5 nm-20 nm. In an embodiment, the indium concentration is uniform in the corrugated upper surface 216E and 218E. Other examples include corrugated upper surfaces 216E and 218E where there is an indium concentration gradient, with the highest indium concentration at the uppermost surface.

In another embodiment, the source portion 216A and a drain portion 218A includes an InGaN that is grown with a concentration of indium between 0.1% to 1%. In yet another embodiment, the source portion 216B and the drain portion 218B include InGaN that is grown in a manner where the indium concentration in the InGaN grown is fixed for a short time period during the deposition process and then increased to a second concentration for an equal time duration, and the process repeated until a maximum indium content of 10% in InGaN is reached. In an embodiment, the percent of indium content can be discretely increased for example from 1% to 3%, to 5% until an indium content of 10% is reached. In another example of a deposition process, the time duration for deposition of InGaN at each concentration of indium can be varied. In an embodiment, three different growth conditions with markedly different indium concentration and deposition times for each interval can be utilized to fabricate a second source structure such as was described in association with the cross-sectional illustration in FIG. 1C.

The MOCVD process described is also accompanied by a dopant diffusion process during the formation of the entire source structure 216 and drain structure 216. The dopant diffusion process injects an n-type dopant such as silicon during the MOCVD growth.

In the illustrated example, the LEO process causes the sidewall 216C of the source structure 216 to overgrow laterally onto a surface of the isolation layer 210 and the sidewall 218C of the drain structure 218 to overgrow laterally onto a surface of the isolation layer 210. Depending on embodiments the source structure 216 and the drain structure 218 are each grown to a height, $H_E$, between 60 nm-100 nm.

Figure 2E:
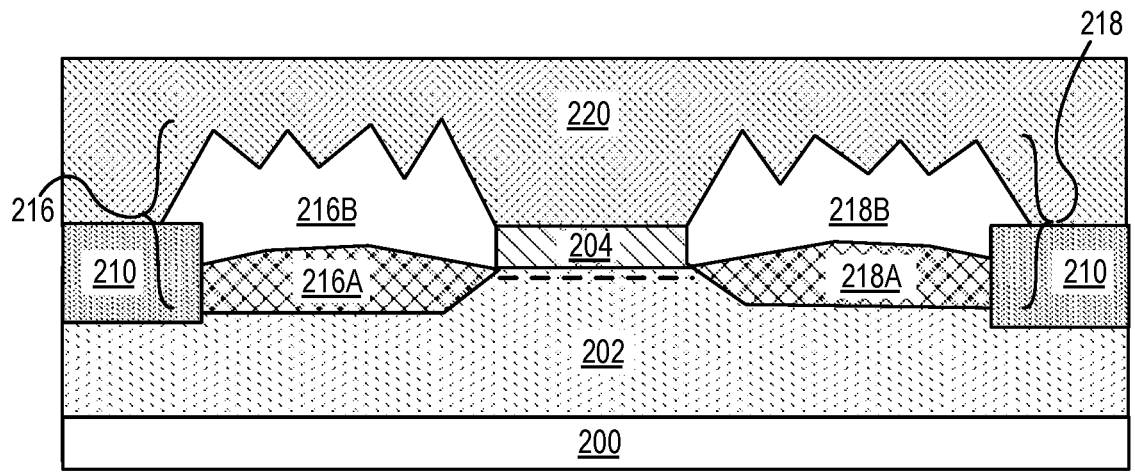
FIG. 2E illustrates a cross-sectional view of the structure of FIG. 2D following the deposition of a dielectric layer on the source structure, drain structure and on the polarization charge inducing layer.

FIG. 2E illustrates a cross-sectional view of the structure of FIG. 2D following the removal of the mask 214 and deposition of a dielectric layer 220 on the source structure 216, drain structure 218 and on the polarization charge inducing layer 204 and on the isolation layer 210. In an embodiment, the dielectric layer 220 includes a material that is the same or substantially the same as the material of the mask 214. In one embodiment, when the mask 214 includes a material that is different from the material of the dielectric layer 220, the mask 214 is removed prior to deposition of the dielectric layer 220. In other examples, the mask 214 is not removed prior to deposition of the dielectric layer to minimize processing on the polarization charge inducing layer 204. In some examples, the dielectric layer 220 is blanket deposited and then planarized for subsequent processing.

Figure 2F:
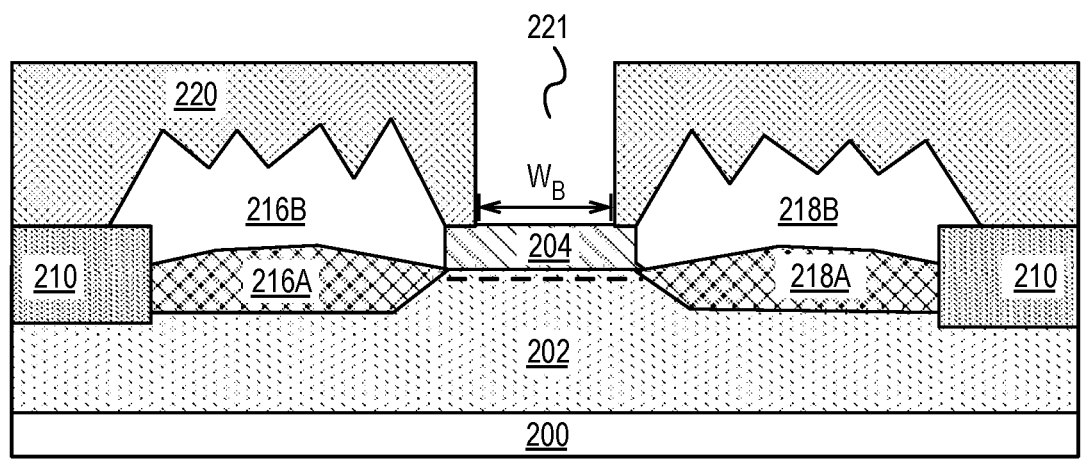
FIG. 2F illustrates a cross-sectional view of the structure of FIG. 2E following the formation of an opening in the dielectric layer over a portion of the polarization charge inducing layer.

FIG. 2F illustrates a cross-sectional view of the structure of FIG. 2E following the formation of a gate opening 221 in the dielectric layer 220 over a portion of the polarization charge inducing layer 204. In an embodiment, a photoresist mask (not shown) is patterned over the dielectric layer 220, where the pattern defines a location for an opening to be formed relative to the polarization charge inducing layer 204. In one embodiment, a plasma etch process is utilized to form the opening 221 in the dielectric layer 220, selectively to the underlying polarization charge inducing layer 204. In an embodiment, gate opening 221 has a width, at the bottom of the opening, $W_B$, that is approximately between 50 nm-500 nm as shown in the cross-sectional illustration of FIG. 2F.

Figure 2G:
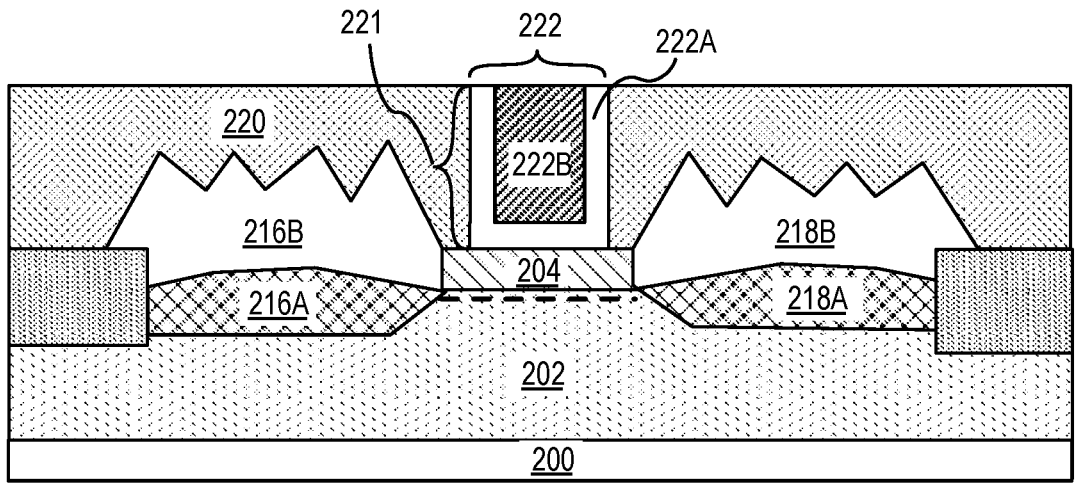
FIG. 2G illustrates a cross-sectional view of the structure of FIG. 2F following the formation of a gate structure in the opening and on the polarization charge inducing layer.

FIG. 2G illustrates cross-sectional view of the structure of FIG. 2F following the formation of a gate 222 in the gate opening 221 and on a portion of the polarization charge inducing layer 204. In an embodiment, a gate dielectric layer 222A is first blanket deposited on a portion of the polarization charge inducing layer 204 exposed by the gate opening 221, and on the dielectric layer 220. The gate dielectric layer 222A is also disposed on sidewalls of the dielectric layer 220 in the gate opening 221. Suitable materials and thicknesses for the gate dielectric layer 222A are same as or substantially the same as the material and thicknesses of the gate dielectric layer 106A. In an embodiment, the gate dielectric layer 222A, is formed by an atomic layer deposition (ALD) process or a PVD process. A gate electrode layer 222B is then blanket deposited on the gate dielectric layer 222A in the gate opening 221. Examples of the gate electrode layer 222B include a material that is the same as or substantially the same as the material of the gate electrode layer 106B described in association with FIG. 1E. After deposition of the gate dielectric layer 222A and the gate electrode layer 222B, a planarization process is performed to remove the gate dielectric layer 222A and the gate electrode layer 222B from an uppermost surface of the dielectric layer 220. In an embodiment, the planarization process includes a chemical mechanical polish process, where the CMP process forms a gate 222 having an uppermost surface that is co-planar or substantially co-planar with the uppermost surface of the dielectric layer 220 as illustrated in the cross-sectional illustration of FIG. 2G.

Figure 2H:
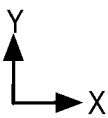
FIG. 2H illustrates a cross-sectional view of the structure of FIG. 2G following the formation of drain and source contact openings above the drain structures and source structures.
Figure 2H:
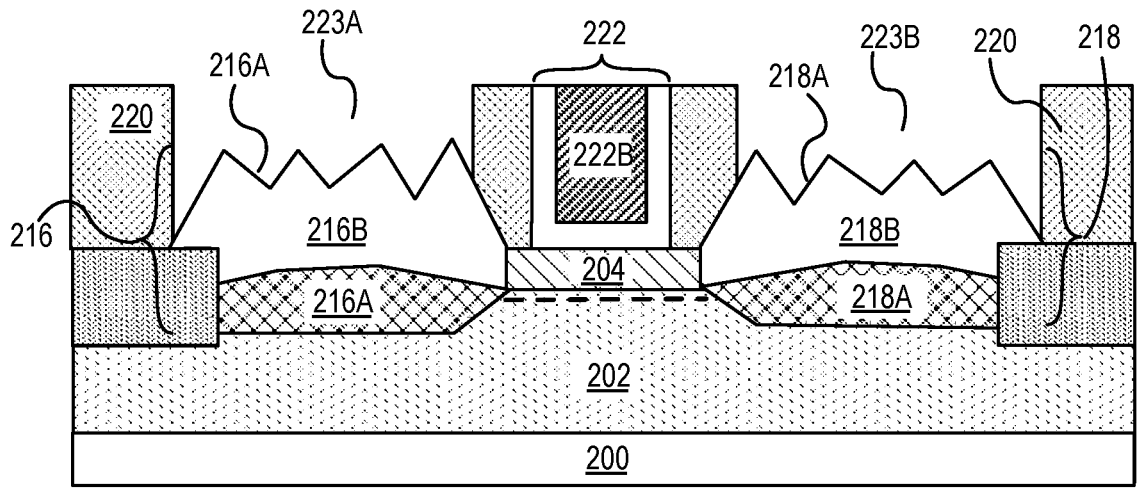

FIG. 2H illustrates the structure of FIG. 2G following the formation of an opening 223A such as a source contact opening, above the source structure 216 and an opening 223B such as a drain contact opening above the drain structure 218. In an embodiment, a photoresist mask (not shown) is patterned over the dielectric layer 220 and the gate 222, where the pattern defines a location for the opening 223A and the opening 223B to be formed relative to the source structure 216 and the drain structure 218, respectively.

In one embodiment, a plasma etch process is utilized to form the opening 223A and opening 223B in the dielectric layer 220, selectively to the underlying source structure 216 and the drain structure 218, respectively. The plasma etch may cause some corner rounding of the corrugate upper surfaces 216A of the source structure 216 and corrugate upper surfaces 218A of the drain structure 218.

In a different embodiment, the opening 223A can expose an entire upper surface area of the source structure 216. In an embodiment, when the opening 223A exposes the entire source structure 216, a maximum contact area can be obtained between a source contact (to be formed in a later operation) and the source structure 216. Similarly, in an embodiment, the opening 223B can expose an entire upper surface area of the drain structure 218. In an embodiment, when the opening 223B exposes the entire drain structure 218, a maximum contact area can be obtained between a drain contact and the drain structure 218. Maximizing the contact area can help to reduce the contact resistance.

Figure 2I:
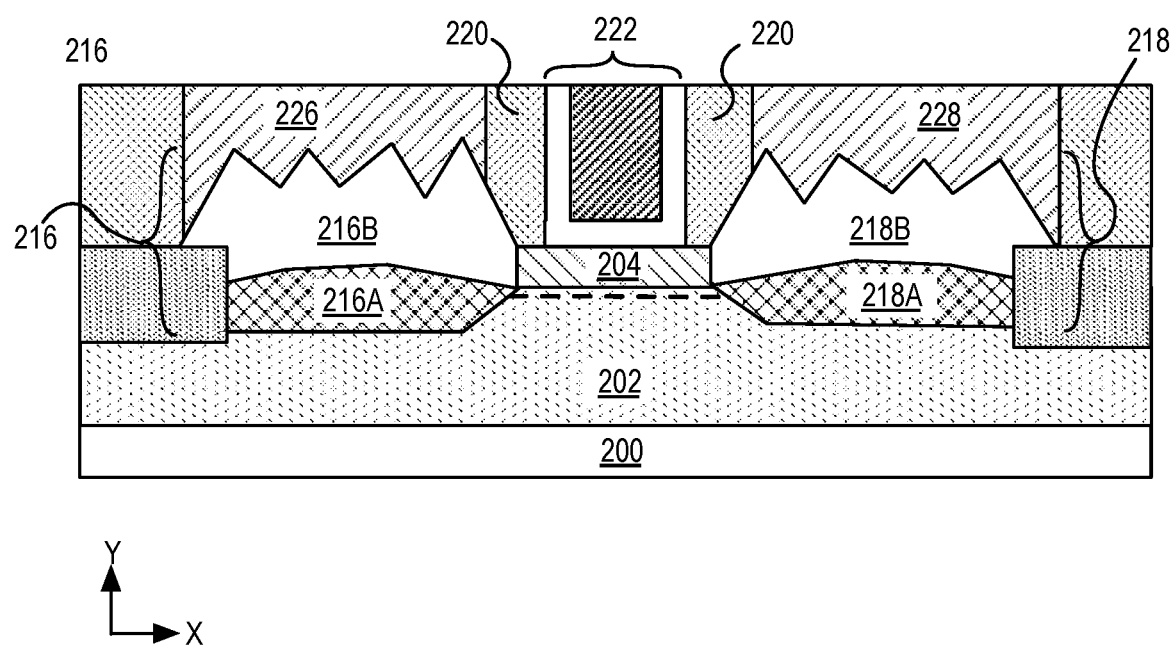
FIG. 2I illustrates a cross-sectional view of the structure of FIG. 2H following the formation of drain contact and source contact in the openings.

FIG. 2I illustrates the structure of FIG. 2H following the formation of a drain contact 226 in the drain contact opening 223B on the drain structure 218 and a source contact 228 in the source contact opening 223A on the source structure 216. In an embodiment, one or more layers of contact metal are deposited inside each of the openings 223A and 223B on the surface of the source structure 216 and on the surface of the drain structure 218, respectively. In the illustrative embodiment, the one or more layers of the contact metal are also blanket deposited on exposed portions of the isolation layer 210 and on the uppermost surface of the dielectric layer 220 and on the gate 222. In an embodiment, the one or more layers of contact metal are deposited using a plasma enhanced chemical vapor deposition (PECVD) or an ALD process. In an embodiment, suitable contact metals include metals such as but not limited to Ti, Al or Ni. In an embodiment, a tungsten capping layer is deposited on the one or more layers of contact metal. In an embodiment, where the tungsten capping layer is deposited on the one or more layers of contact metal, the one or more layers of contact metal is first deposited on the bottom and on the sides of the opening 223A and 223B and the tungsten capping layer is deposited to fill the remaining portion of the openings 223A and 223B. In an embodiment, the one or more layers of contact metal is deposited to a thickness in the range of 10-30 nm, and the tungsten capping layer is deposited to fill the remaining portion of each of the openings 223A and 223B.

A planarization process is carried out to remove the one or more layers of contact metal from the uppermost surface of the dielectric layer 220. In one embodiment, the planarization process includes a chemical mechanical polish (CMP) process. The CMP process removes all the one or more layers of contact metal from the uppermost surfaces of the dielectric layer 220, and from the uppermost surface of the gate 222. The CMP process leaves the one or more layers of contact metal in the openings 223A and 223B to form a source contact 226 and a drain contact 228.

Figure 3:
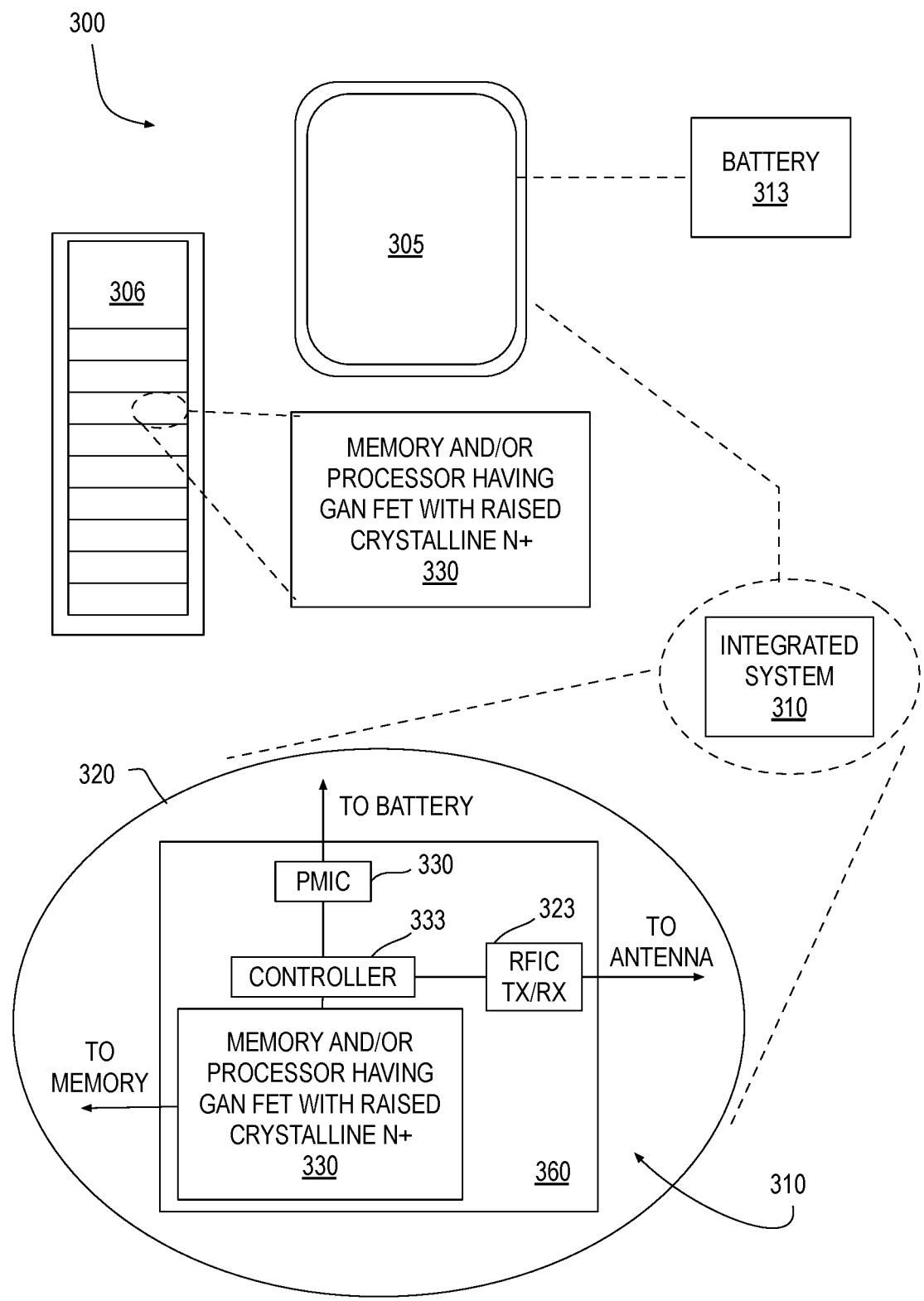
FIG. 3 is a functional block diagram of a group III-N SoC implementation of a mobile computing platform, in accordance with an embodiment of the present invention.

FIG. 3 illustrates a system 300 in which a mobile computing platform 305 and/or a data server machine 306 employs an IC including at least one group III-N transistor, such as the device 100 including a source and a drain structure having a first portion and a second portion having an indium content that increases with distance from the first portion. The transistor 100 may have one or more all the features of transistor 100 described in association with FIGS. 1A-1C. The server machine 306 may be any commercial server, for example including any number of high-performance computing platforms disposed within a rack and networked together for electronic data processing, which in the exemplary embodiment includes a packaged monolithic 1C 350. The mobile computing platform 305 may be any portable device configured for each of electronic data display, electronic data processing, wireless electronic data transmission, or the like. For example, the mobile computing platform 305 may be any of a tablet, a smart phone, laptop computer, etc., and may include a display screen (e.g., a capacitive, inductive, resistive, or optical touchscreen), a chip-level or package-level integrated system 310, and a battery 315.

Whether disposed within the integrated system 310 illustrated in the expanded view 320, or as a stand-alone packaged chip within the server machine 306, packaged monolithic IC 350 includes a memory chip (e.g., RAM), or a processor chip (e.g., a microprocessor, a multi-core microprocessor, graphics processor, or the like) including at least one group III-N transistor, such as the device 100 including an epitaxially grown source and drain structures formed on a backbone of fin like structures, for example as describe elsewhere herein. The monolithic IC 350 may be further coupled to a board, a substrate, or an interposer 360 along with, one or more of a power management integrated circuit (PMIC) 330, RF (wireless) integrated circuit (RFIC) 325 including a wideband RF (wireless) transmitter and/or receiver (TX/RX) (e.g., including a digital baseband and an analog front end module further comprises a power amplifier on a transmit path and a low noise amplifier on a receive path), and a controller thereof 335.

Functionally, PMIC 330 may perform battery power regulation, DC-to-DC conversion, etc., and so has an input coupled to battery 315 and with an output providing a current supply to other functional modules. As further illustrated, in the exemplary embodiment, RFIC 325 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 3G, 5G, and beyond. In alternative implementations, each of these board-level modules may be integrated onto separate ICs coupled to the package substrate of the monolithic IC 350 or within a single IC coupled to the package substrate of the monolithic IC 350.

Figure 4:
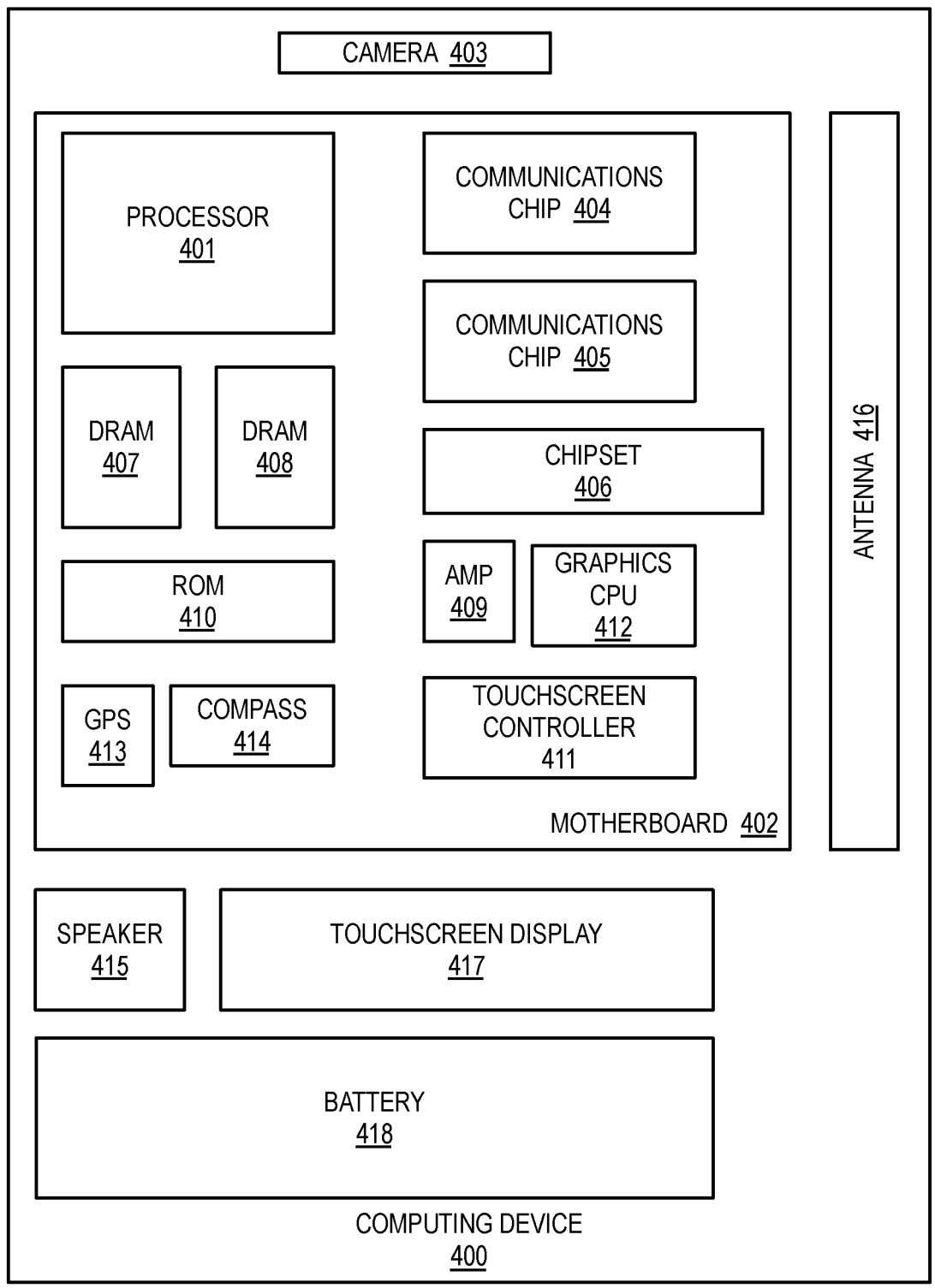
FIG. 4 illustrates a computing device in accordance with embodiments of the present invention.

FIG. 4 is a functional block diagram of a computing device 400, arranged in accordance with at least some implementations of the present disclosure. Computing device 400 may be found inside platform 300, for example, and further includes a motherboard 402 hosting a number of components, such as but not limited to a processor 401 (e.g., an applications processor) and one or more communications chips 404, 405. Processor 401 may be physically and/or electrically coupled to motherboard 402. In some examples, processor 401 includes an integrated circuit die packaged within the processor 401. In general, the term "processor" may refer to any device or portion of a device that processes electronic data from registers and/or memory to transform that electronic data into other electronic data that may be stored in registers and/or memory. A device or component of computing device 400 may include transistor(s) or transistor structure(s) such as transistor 100 including a source and drain structure having a first portion and a second portion having an indium content that increases with distance from the first portion, for example.

In various examples, one or more communication chips 404, 405 may also be physically and/or electrically coupled to the motherboard 402. In further implementations, communication chips 404 may be part of processor 401. Depending on its applications, computing device 400 may include other components that may or may not be physically and electrically coupled to motherboard 402. These other components may include, but are not limited to, volatile memory (e.g., DRAM) 407, 408, non-volatile memory (e.g., ROM) 410, a graphics processor 412, flash memory, global positioning system (GPS) device 413, compass 414, a chipset 406, an antenna 416, a power amplifier 409, a touchscreen controller 411, a touchscreen display 417, a speaker 415, a camera 403, and a battery 418, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 404, 405 may enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 404, 405 may implement any of a number of wireless standards or protocols, including but not limited to those described elsewhere herein. As discussed, computing device 400 may include a plurality of communication chips 404, 405. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

In various implementations, the computing device 400 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Figure 5:
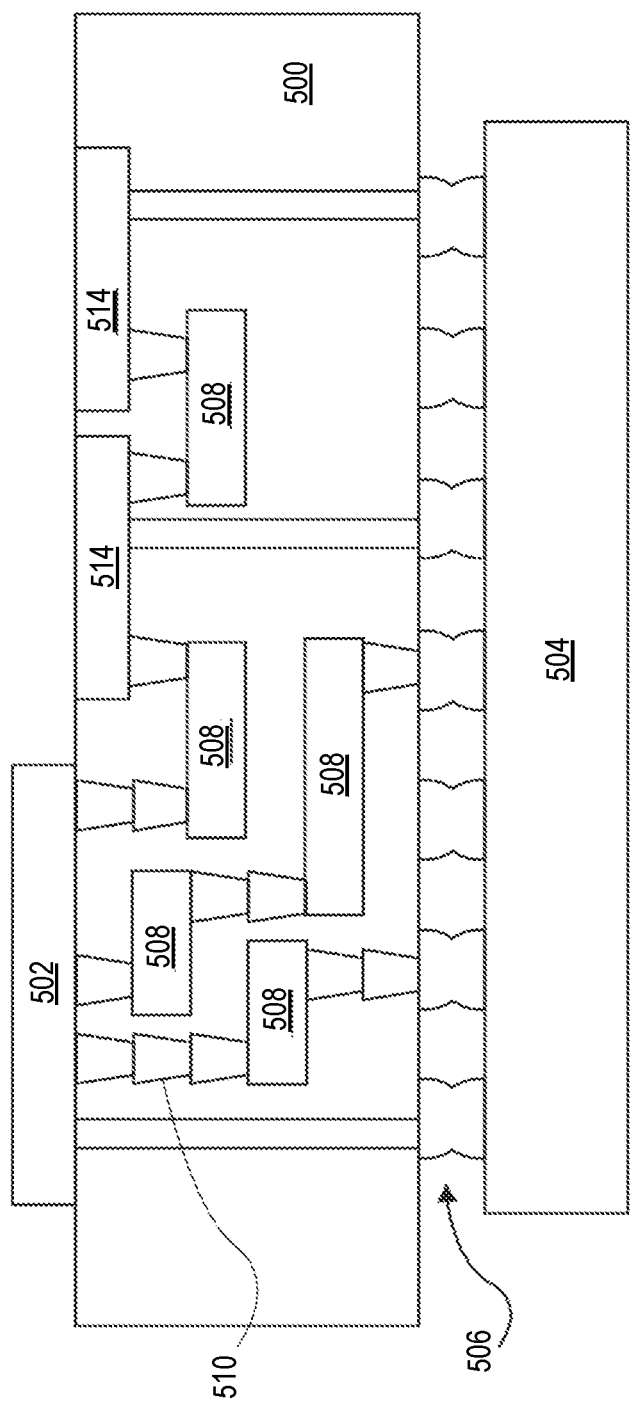
FIG. 5 illustrates an integrated circuit structure in accordance with embodiments of the present invention.

FIG. 5 illustrates an integrated circuit structure 500 that includes one or more embodiments of the disclosure. The integrated circuit (IC) structure 500 is an intervening structure used to bridge a first substrate 502 to a second substrate 504. The first substrate 502 may be, for instance, an integrated circuit die. The second substrate 504 may be, for instance, a memory module, a computer mother, or another integrated circuit die. The integrated circuit die may include one or more devices such as a device 100 including a transistor including a source and a drain structure having a first portion and a second portion having an indium content that increases with distance from the first portion. Generally, the purpose of an integrated circuit (IC) structure 500 is to spread a connection to a wider pitch or to reroute a connection to a different connection. For example, an integrated circuit (IC) structure 500 may couple an integrated circuit die to a ball grid array (BGA) 511 that can subsequently be coupled to the second substrate 504. In some embodiments, the first and second substrates 502/504 are attached to opposing sides of the integrated circuit (IC) structure 500. In other embodiments, the first and second substrates 502/504 are attached to the same side of the integrated circuit (IC) structure 500. And in further embodiments, three or more substrates are interconnected by way of the integrated circuit (IC) structure 500.

The integrated circuit (IC) structure 500 may be formed of an epoxy resin, a fiberglass-reinforced epoxy resin, a ceramic material, or a polymer material such as polyimide. In further implementations, the integrated circuit (IC) structure 500 may be formed of alternate rigid or flexible materials that may include the same materials described above for use in a semiconductor substrate, such as silicon, germanium, and other group III-N, group III-V and group IV materials.

The integrated circuit (IC) structure 500 may include metal interconnects 508 and via 510, including but not limited to through-silicon vias (TSVs) 510. The integrated circuit (IC) structure 500 may further include embedded devices 514, including both passive and active devices. Such devices include, but are not limited to, capacitors, decoupling capacitors, resistors, inductors, fuses, diodes, transformers, group III-N transistors, one or more magnetic tunnel junction or resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 500. In accordance with embodiments of the present disclosure, apparatuses or processes disclosed herein may be used in the fabrication of integrated circuit (IC) structure 500.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

As used in any implementation described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

Thus, embodiments of the present disclosure include group III-N devices with reduced contact resistance and their methods of fabrication.

In first examples, a device includes a first layer including a first group III-nitride (III-N) material, a polarization charge inducing layer, including a second III-N material, above the first layer, a gate electrode above the polarization charge inducing layer and a source structure and a drain structure on opposite sides of the gate electrode, the source structure and the drain structure both including a first portion adjacent to the first layer and a second portion above the first portion, the first portion including a third III-N material with an impurity dopant, and the second portion including a fourth III-N material, the fourth III-N material having the impurity dopant and including indium, wherein the indium content increases with distance from the first portion.

In second examples, for any of first examples, the first III-N material includes a gallium nitride (GaN) and the second III-N material includes a III-N material that includes aluminum.

In third examples, for any of the first through second examples, the impurity dopant includes an n-type impurity dopant.

In fourth examples, for any of the first through third examples, the first portion of the source structure and the drain structure each include a material that is lattice matched to the first group III-nitride (III-N) semiconductor material.

In sixth examples, for any of the first through fifth examples, the indium content increases to a maximum of 10 atomic percent of the fourth III-N material with distance away from the first portion.

In seventh examples, for any of the first through sixth examples, the first portion of the source structure and the drain structure each include a material having a second indium content, wherein the second indium content is less than the indium content of the second portion.

In eighth examples, for any of the first through seventh examples, upper surfaces of each of the second portions of the source structure and the drain structure are corrugated and each interface a metal electrode.

In ninth examples, for any of the first through eighth examples, the indium content is constant within the corrugation.

In tenth examples, for any of the first through ninth examples, the corrugation increases with increasing indium content.

In eleventh examples, for any of the first through tenth examples, the source structure has a height between 50 nm-100 nm and the drain structure has a height between 50 nm-100 nm.

In twelfth examples, for any of the first through eleventh examples, the first portion has a thickness between 10 nm-20 nm and the second portion has a thickness between 30 nm-80 nm.

In thirteenth examples, for any of the first through twelfth examples, the source structure and a drain structure include faceted crystals having sidewalls that are approximately 60 degrees with respect to an uppermost surface of the polarization charge inducing layer.

In fourteenth examples, for any of the first through thirteenth examples, the gate electrode includes a work function layer and a gate metal cap.

In fifteenth examples, for any of the first through fourteenth examples further includes a gate dielectric layer between the gate electrode and the polarization charge inducing layer.

In sixteenth examples, a method of fabricating a device includes forming a first layer including a first group III-nitride (III-N) semiconductor material above a substrate and forming a polarization charge inducing layer including a second III-N material above the first layer. The method further includes forming a first recess and a second recess, laterally separated from the first recess, in the first III-N semiconductor material and forming a source structure in the first recess and a drain structure in the second recess, wherein forming each of the source and drain structures includes depositing a first portion above the first III-N material and depositing a second portion above the first portion, wherein the deposition includes gradually increasing the indium content in the second portion. The method further includes forming a gate dielectric layer on the polarization charge inducing layer and forming a gate electrode on the gate dielectric layer.

In seventeenth examples, for any of sixteenth examples, the method of forming the first portion of the source structure and the first portion of the drain structure includes lattice matching to the III-N material.

In eighteenth examples, for any of the sixteenth through seventeenth examples, the method of forming the second portion of the source structure and the second portion of the drain structure includes increasing an amount of indium concentration during the deposition process.

In nineteenth examples, for any of the fifteenth through eighteenth examples, the method of forming the source structure and the drain structure includes doping source structure and the drain structure with an n-type impurity dopant during the deposition.

In twentieth examples, for any of the fifteenth through nineteenth examples, the method of forming the device includes forming the III-N material on a silicon substrate.

In twenty first examples, for any of the fifteenth through twentieth examples, the method of forming the first recess and second recess includes masking a portion of the polarization charge inducing layer and etching the unmasked portions of the polarization charge inducing layer to uncover the III-N material and then etching portions of the III-N material.

In twenty second examples, a system includes a processor and a radio transceiver coupled to the processor, wherein the transceiver includes a group III-Nitride (III-N) transistor. The III-N transistor includes a first layer including a first group III-nitride (III-N) semiconductor material, a polarization charge inducing layer above the first layer, the polarization charge inducing layer including a second III-N material, a gate electrode above the polarization charge inducing layer; and a source structure and a drain structure on opposite sides of the gate electrode, the source structure and the drain structure both including a first portion adjacent to the first layer and a second portion above the first portion, the first portion including a third III-N material with an impurity dopant, and the second portion including a fourth III-N material, the fourth III-N material having the impurity dopant and including indium, wherein the indium concentration increases with distance from the first portion.

In twenty third examples, for any of twentieth examples, the first III-N material includes a gallium nitride (GaN) and the second III-N material includes a III-N material that includes aluminum.

In twenty fourth examples, for any of the twenty second through twenty third examples, the indium content increases to a maximum of 10 atomic percent of the fourth III-N material with distance away from the first portion.

In twenty fifth examples, for any of the twenty second through twenty fourth examples, the first portion has a thickness between 10 nm-20 nm and the second portion has a thickness between 30 nm-80 nm.

What is claimed is:

1. A device comprising:
   a first layer comprising a first group III-nitride (III-N) material;
   a polarization charge inducing layer on the first layer, the polarization charge inducing layer comprising a second III-N material, wherein the first layer and the polarization charge inducing layer meet at an interface therebetween;
   a gate electrode above the polarization charge inducing layer; and
   a source structure and a drain structure on opposite sides of the gate electrode, one of the source structure or the drain structure being located within a recess in the first layer and comprising a first portion adjacent to the first layer and a second portion above the first portion, the first portion comprising a third III-N material comprising an impurity dopant and not more than one atomic percent indium, the second portion comprising a fourth III-N material comprising the impurity dopant and indium, wherein an indium content of the second portion increases with distance from the first portion, and wherein an upper surface of the first portion is above the interface between the first layer and the polarization charge inducing layer.

2. The device of claim 1, wherein the first III-N material comprises gallium and nitrogen and the second III-N material comprises aluminum.

3. The device of claim 1, wherein the impurity dopant comprises an n-type impurity dopant.

4. The device of claim 1, wherein the first portion comprises a material that is lattice matched to the first group III-N material.

5. The device of claim 1, wherein the indium content within the second portion increases with distance away from the first portion to a maximum of 10 atomic percent.

6. The device of claim 5, wherein the first portion comprises not more than 0.1 atomic percent indium.

7. The device of claim 6, wherein an upper surface of the second portion of the source or drain structure comprise corrugations.

8. The device of claim 7, wherein the indium content is uniform within individual ones of the corrugations.

9. The device of claim 1, wherein the source structure has a height between 50 nm and 100 nm, and the drain structure has a height between 50 nm and 100 nm.

10. The device of claim 9, wherein the first portion has a thickness between 10 nm and 30 nm and the second portion has a thickness between 30 nm and 80 nm.

11. The device of claim 1, wherein the source structure and the drain structure comprise faceted crystals having sidewalls that are approximately 60 degrees from a plane of the polarization charge inducing layer.

12. The device of claim 1, wherein the polarization charge inducing layer has a thickness between 3 nm and 20 nm.

13. The device of claim 1, further comprising a gate dielectric layer between the gate electrode and the polarization charge inducing layer.

14. The device of claim 1, wherein the gate electrode comprises a work function layer and a gate metal cap.

15. A system comprising:
   a processor; and
   a radio transceiver coupled to the processor, wherein the transceiver includes the device of claim 1.

16. The system of claim 15, further comprising a battery coupled to power the processor or the transceiver.

17. A method of fabricating a device, the method comprising:
   forming a first layer comprising a first group III-nitride (III-N) material above a substrate;
   forming a polarization charge inducing layer comprising a second III-N material above the first layer, wherein the first layer and the polarization charge inducing layer meet at an interface therebetween;
   forming a first recess and a second recess in the first III-N material, the second recess laterally separated from the first recess;

forming a source structure in the first recess and a drain structure in the second recess, wherein forming at least one of the source structure or the drain structure comprises depositing a first portion above the first group III-N material and depositing a second portion above the first portion, wherein the first portion comprises not more than one atomic percent indium, wherein the depositing comprises increasing an indium content over a time that the second portion is deposited, and wherein an upper surface of the first portion is above the interface between the first layer and the polarization charge inducing layer;

forming a gate dielectric layer on the polarization charge inducing layer; and forming a gate electrode on the gate dielectric layer.

18. The method of claim 17, wherein forming the first portion comprises depositing a material that is lattice matched to the first group III-N material.

19. The method of claim 17, wherein the first portion comprises not more than 0.1 atomic percent indium.

20. The method of claim 17, wherein forming the first recess and second recess comprises masking a portion of the polarization charge inducing layer and etching the unmasked portions of the polarization charge inducing layer to uncover the first group III-N material and then etching portions of the first group III-N material.

* * * * *